(12) United States Patent
Namba et al.

(10) Patent No.: US 11,127,695 B2
(45) Date of Patent: Sep. 21, 2021

(54) POWER CONVERSION DEVICE FOR REDUCING AN INDUCTANCE DIFFERENCE BETWEEN CONTROL SIGNAL WIRES OF A POWER SEMICONDUCTOR AND SUPPRESSING A CURRENT UNBALANCING OF THE CONTROL SIGNALS

(71) Applicant: HITACHI AUTOMOTIVE SYSTEMS, LTD., Hitachinaka (JP)

(72) Inventors: Akihiro Namba, Tokyo (JP); Takashi Hirao, Tokyo (JP); Masami Oonishi, Tokyo (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 2 days.

(21) Appl. No.: 16/648,102

(22) PCT Filed: Jul. 27, 2018

(86) PCT No.: PCT/JP2018/028189
§ 371 (c)(1),
(2) Date: Mar. 17, 2020

(87) PCT Pub. No.: WO2019/064874
PCT Pub. Date: Apr. 4, 2019

(65) Prior Publication Data
US 2020/0258853 A1    Aug. 13, 2020

(30) Foreign Application Priority Data
Sep. 29, 2017   (JP) .............................. JP2017-189404

(51) Int. Cl.
*H01L 23/64*     (2006.01)
*H01L 23/367*    (2006.01)
(Continued)

(52) U.S. Cl.
CPC ........ *H01L 23/645* (2013.01); *H01L 23/3672* (2013.01); *H01L 23/49844* (2013.01);
(Continued)

(58) Field of Classification Search
CPC ............... H01L 23/645; H01L 23/3672; H01L 23/49844; H01L 24/48; H01L 25/072;
(Continued)

(56) References Cited

U.S. PATENT DOCUMENTS 4,907,068 A    3/1990  Amann et al.
RE35,807 E     5/1998  Iversen et al.
(Continued)

FOREIGN PATENT DOCUMENTS

DE    60308148 T2    8/2007
DE    60032651 T2    10/2007
(Continued)

OTHER PUBLICATIONS

International Search Report, PCT/JP2018/028189, Sep. 25, 2018, 2 pgs.
(Continued)

*Primary Examiner* — Duy T Nguyen
(74) *Attorney, Agent, or Firm* — Volpe Koenig

(57) ABSTRACT

A power conversion device includes first and second power semiconductor elements, and a circuit for transferring a drive signal of the first and second power semiconductor elements. The circuit board includes a first emitter wire which is formed along an arranging direction of the first power semiconductor element and the second power semiconductor element, a first gate wire which is disposed between the first power semiconductor element and the first emitter wire, a second gate wire which is disposed between the second power semiconductor element and the emitter wire, a third gate wire which is disposed to face the first gate (Continued)

wire and the second gate wire with the emitter wire interposed between the third gate wire and the first gate wire and the second gate wire, and a first gate resistor which connects the first gate wire and the third gate wire over the first emitter wire.

4 Claims, 13 Drawing Sheets

(51) Int. Cl.
*H01L 23/498* (2006.01)
*H01L 23/00* (2006.01)
*H01L 25/07* (2006.01)
*H01L 25/16* (2006.01)

(52) U.S. Cl.
CPC ............ *H01L 24/48* (2013.01); *H01L 25/072* (2013.01); *H01L 25/16* (2013.01); *H01L 2224/48225* (2013.01); *H01L 2924/1207* (2013.01); *H01L 2924/13055* (2013.01); *H01L 2924/14252* (2013.01); *H01L 2924/30107* (2013.01)

(58) Field of Classification Search
CPC ........... H01L 25/16; H01L 2224/48225; H01L 2924/1207; H01L 2924/13055; H01L 2924/14252; H01L 2924/30107; H01L 2224/0603; H01L 2224/49113; H01L 25/07; H01L 25/18; H02M 7/5387; H02M 1/088; H02M 7/003
USPC ......................................................... 257/668
See application file for complete search history.

(56) References Cited

U.S. PATENT DOCUMENTS

| | | | |
|---|---|---|---|
| 6,445,068 | B1 | 9/2002 | Sofue et al. |
| 6,939,743 | B2 | 9/2005 | Frey |
| 7,342,262 | B2 | 3/2008 | Frey |
| 9,087,817 | B2 | 7/2015 | Michikoshi et al. |
| 2009/0067205 | A1* | 3/2009 | Oyobe .................. B60L 15/007 363/98 |
| 2013/0001805 | A1 | 1/2013 | Azuma et al. |
| 2015/0023083 | A1* | 1/2015 | Nakagawa .......... H02M 7/5387 363/132 |
| 2015/0207429 | A1* | 7/2015 | Akiyama ............. H03K 17/165 363/131 |
| 2017/0033710 | A1* | 2/2017 | Muto ................ H01L 23/49541 |
| 2017/0069569 | A1 | 3/2017 | Matsuyama |
| 2018/0056795 | A1* | 3/2018 | Xu ........................ H02M 1/088 |

FOREIGN PATENT DOCUMENTS

| | | |
|---|---|---|
| JP | 2001-185679 A | 7/2001 |
| JP | 2002-141465 A | 5/2002 |
| JP | 2005-101256 A | 4/2005 |
| JP | 2006-094557 A | 4/2006 |
| JP | 2009-021345 A | 1/2009 |
| JP | 2010-027710 A | 2/2010 |
| JP | 2016-046842 A | 4/2016 |
| JP | 2017-034053 A | 2/2017 |
| WO | 2014/002625 A1 | 1/2014 |

OTHER PUBLICATIONS

German Office Action dated Mar. 10, 2021 for German Patent Application No. 112018003628.6.

* cited by examiner

POWER CONVERSION DEVICE FOR REDUCING AN INDUCTANCE DIFFERENCE BETWEEN CONTROL SIGNAL WIRES OF A POWER SEMICONDUCTOR AND SUPPRESSING A CURRENT UNBALANCING OF THE CONTROL SIGNALS

TECHNICAL FIELD

The present invention relates to a power conversion device which converts a DC power into an AC power or an AC power into DC power, and particularly to a power conversion device which is used in a hybrid vehicle and an electric vehicle.

BACKGROUND ART

In a power conversion device used in a hybrid vehicle and an electric vehicle, it is required to increase output power as driving torque of the hybrid vehicle and the electric vehicle is increased. A plurality of power semiconductors are connected in parallel in order to cope with the increase of the output power.

However, the power semiconductors connected in parallel are necessarily switched at the same time in order to bring out the performance of the power semiconductors connected in parallel. There is a need to prevent unbalancing of the impedance of the control signal line through which a control signal is transferred to each power semiconductor.

With respect to such a problem, PTL 1 discloses a configuration in which the control signal lines are stacked for the purpose of suppressing the current of an emitter loop which is formed in emitters of a plurality of power semiconductors and causes a current unbalancing.

However, there is a need to stack the control signal lines in a multi-layer substrate, which causes a tendency toward a larger control signal substrate.

CITATION LIST

Patent Literature

PTL 1: JP 2016-46842 A

SUMMARY OF INVENTION

Technical Problem

An object of the invention is to suppress a tendency toward a larger control signal substrate while suppressing a current unbalancing of a control signal which is transferred to each power semiconductor.

Solution to Problem

A power conversion device according to the invention includes a first power semiconductor element, a second power semiconductor element, and a circuit board which includes a circuit to transfer a drive signal of the first power semiconductor element and the second power semiconductor element. The circuit board includes a first emitter wire which is formed along an arranging direction of the first power semiconductor element and the second power semiconductor element, a first gate wire which is disposed between the first power semiconductor element and the first emitter wire, a second gate wire which is disposed between the second power semiconductor element and the emitter wire, a third gate wire which is disposed to face the first gate wire and the second gate wire with the emitter wire interposed between the third gate wire and the first gate wire and the second gate wire, and a first gate resistor which connects the first gate wire and the third gate wire over the first emitter wire.

Advantageous Effects of Invention

According to the invention, it is possible to reduce an inductance difference between control signal wires of a power semiconductor, and to suppress a tendency toward a larger control signal substrate while suppressing a current unbalancing of the control signal.

DESCRIPTION OF EMBODIMENTS

Hereinafter, embodiments will be described using the drawings.

First Embodiment

In this embodiment, the description will be given about an example of a power conversion device which can reduce an inductance difference between control signal wires of a power semiconductor, and can suppress a current unbalancing of the control signals.

Figure 1:
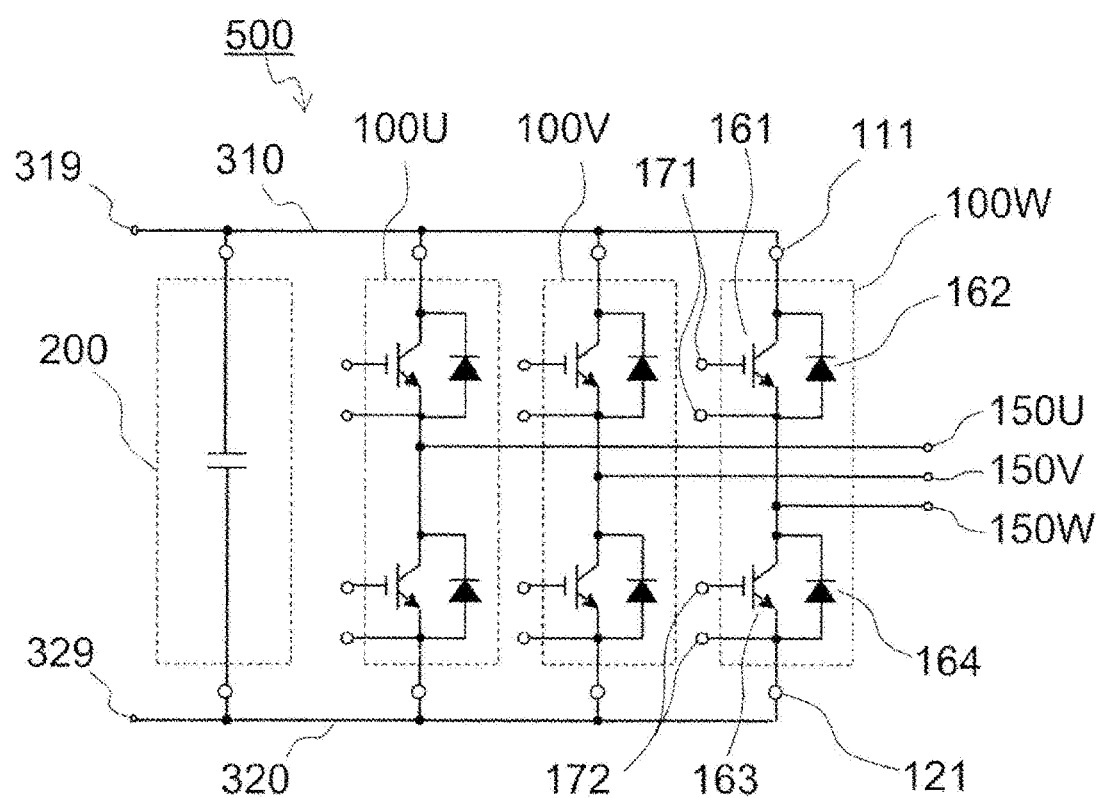
FIG. 1 is an electrical diagram of a power conversion device of an embodiment.

FIG. 1 is an electrical diagram of a power conversion device 500 of this embodiment. An operation principle of the power conversion device 500 of this embodiment will be described using FIG. 1.

The power conversion device 500 is configured by a power semiconductor module 100, a capacitor module 200, a positive pole conductor 310, and a negative pole conductor 320. The power conversion device 500 of this embodiment converts the DC current into the three-phase AC current, or the three-phase AC current into the DC current, and is configured by three power semiconductor modules 100U, 100V, and 100W.

Each of the power semiconductor modules 100U to 100W is provided with an AC terminal. In other words, the power semiconductor module 100U includes a module AC terminal 150U. The power semiconductor module 100V includes a module AC terminal 150V. The power semiconductor module 100 W includes a module AC terminal 150W. The module AC terminals 150U, 150V, and 150W are connected to a three-phase terminal of a motor.

A DC input/output positive pole terminal 319 of the positive pole conductor 310 is connected to a positive pole terminal of a high-voltage battery. A DC input/output negative pole terminal 329 of the negative pole conductor plate 320 is connected to a negative pole terminal of the high-voltage battery.

The capacitor module 200 is provided with a positive pole terminal electrically connected to the positive pole conductor 310, and a negative pole terminal electrically connected to the negative pole conductor 320.

The power semiconductor module 100 is configured by an upper arm and a lower arm. Further, an insulated gate bipolar transistor will be used as an example of a semiconductor element below, and will be abbreviated as IGBT. The upper arm of the power semiconductor module 100 is configured by an IGBT 161 and a diode 162. In addition, a control terminal 171 is provided in the upper arm to turn on or off the IGBT 161. The lower arm of the power semiconductor module 100 is configured by an IGBT 163 and a diode 164. In addition, a control terminal 172 is provided in the lower arm to turn on or off the IGBT 163.

In a collector of the IGBT 161 of the upper arm, a first module positive pole terminal 111 is provided to connect the positive pole conductor 310. In an emitter of the IGBT 163 of the lower arm, a first module negative pole terminal 121 is provided to connect the negative pole conductor 320. In addition, a module AC terminal 150 is provided between the emitter of the upper arm IGBT 161 and the collector of the lower arm IGBT 163.

The power conversion device 500 can convert a DC current into an AC current, or an AC current into a DC current by switching a control signal to be applied to the control terminal 171 of the upper arm and the control terminal 172 of the lower arm. For example, the current flows from the positive pole conductor plate 310 through the module positive pole terminal 111 toward the module AC terminal 150 in a normal state where the upper arm IGBT 161 of the power semiconductor module 100 is turned on, and thus the lower arm IGBT 163 is turned off. On the contrary, the current flows from the module AC terminal 150 toward the module negative pole terminal 121 in a normal state where the upper arm IGBT 161 of the power semiconductor module 100 is turned off, and the lower arm IGBT 163 is turned on.

Figure 2:
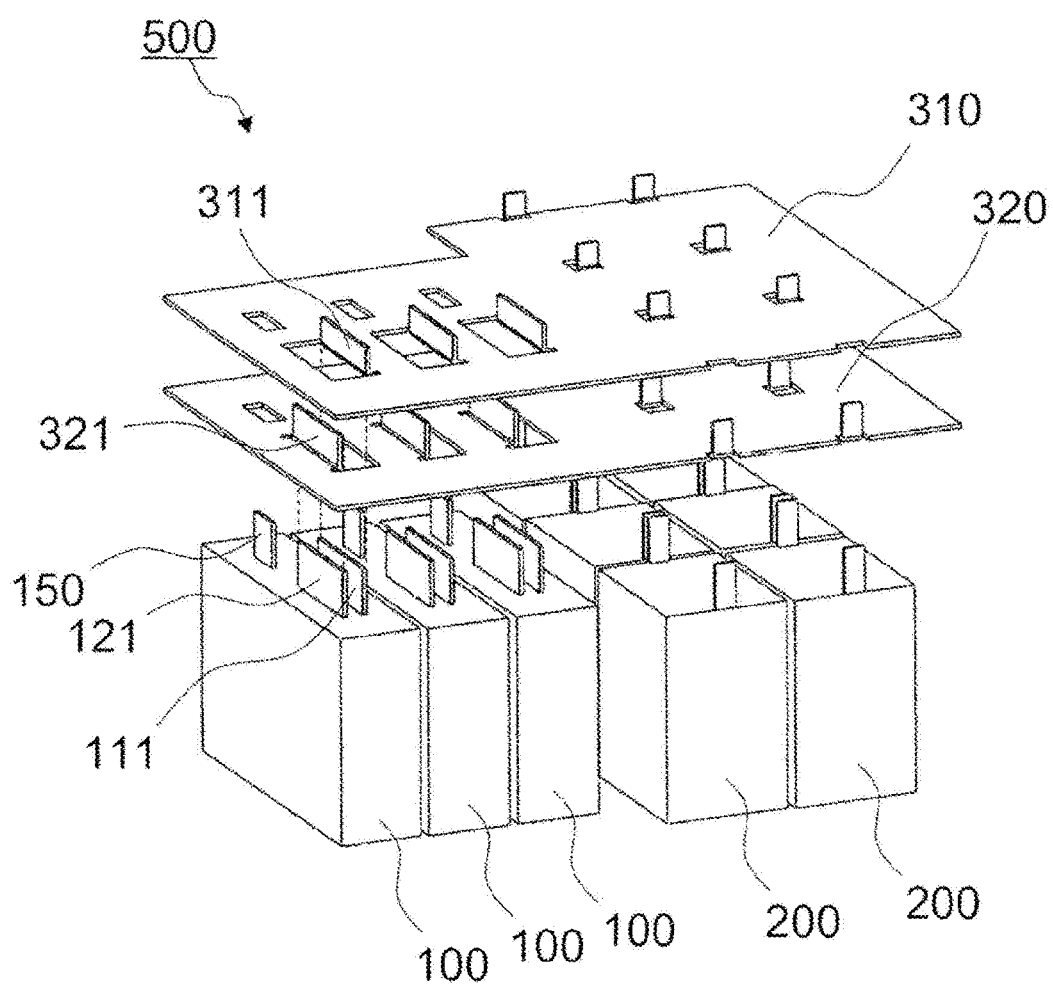
FIG. 2 is a conceptual exploded perspective view of a power conversion device 500 of the embodiment.

FIG. 2 is a conceptual exploded perspective view of the power conversion device 500 of the embodiment.

The power conversion device 500 is configured by the positive pole conductor 310, the negative pole conductor 320, the power semiconductor module 100, and the capacitor module 200. The capacitor module 200 is provided with a positive pole terminal electrically connected to the positive pole conductor 310, and a negative pole terminal electrically connected to the negative pole conductor 320.

The first module positive pole terminal 111 of the power semiconductor module 100 is electrically connected to a first positive pole terminal 311 of the positive pole conductor 310. The first module negative pole terminal 121 of the power semiconductor module 100 is electrically connected to a first negative pole terminal 321 of the negative pole conductor 320.

Figure 3:
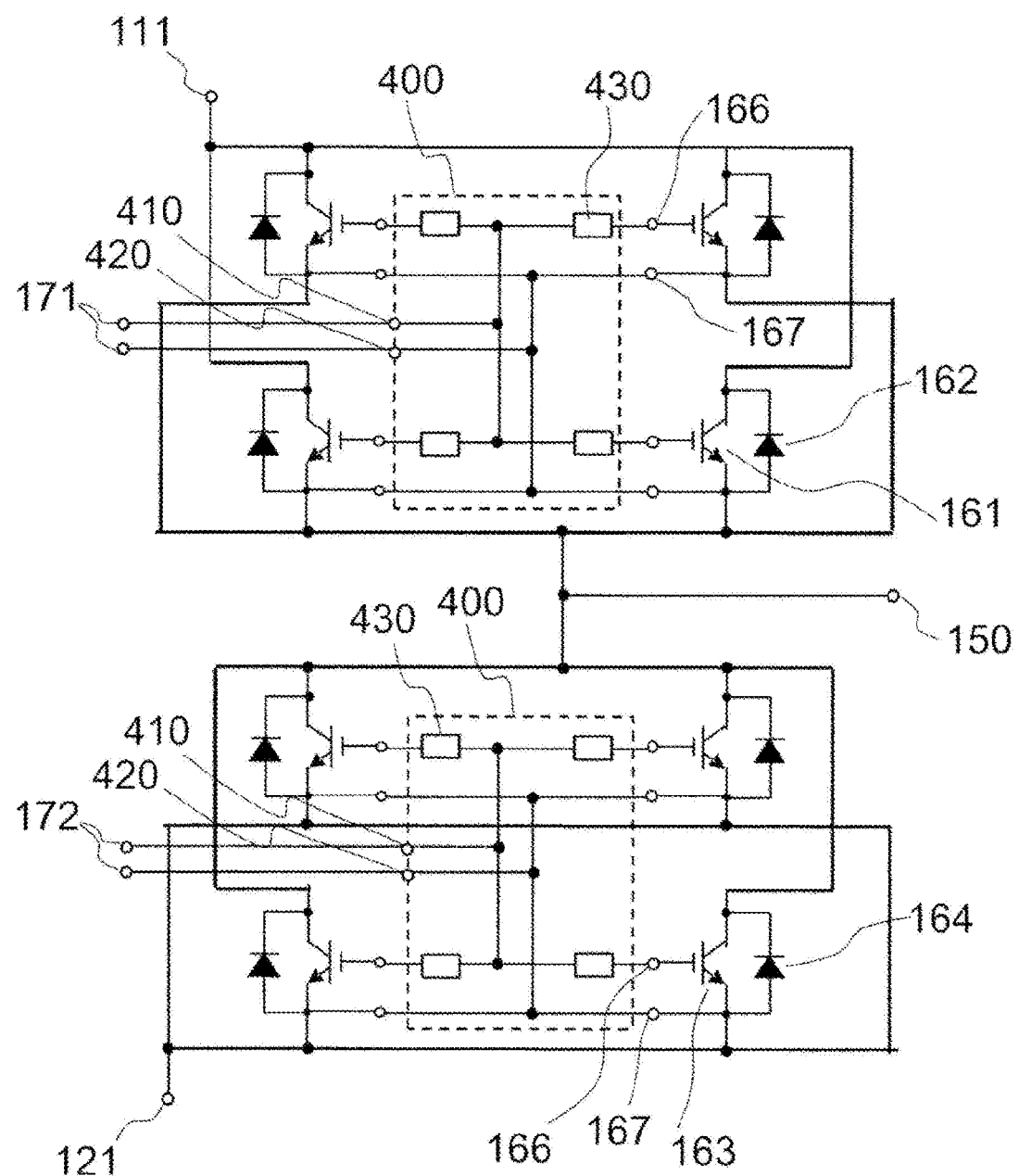
FIG. 3 is a diagram illustrating an example of a power module 100 in which IGBTs and diodes in a circuit structure of FIG. 1 are configured using four power semiconductors.

Next, the description will be given about an exemplary configuration in a case where a plurality of power semiconductors are connected in parallel to improve output power. FIG. 3 is a diagram illustrating an example of the power module 100 in which IGBTs and diodes in a circuit structure of FIG. 1 are configured using four power semiconductors.

On the upper arm, four IGBTs 161 and four diodes 162 are connected in parallel. The source terminals of the four IGBTs 161 and the cathode terminals of the diodes 162 are connected to the module positive pole terminal 111. In addition, the emitter terminals of the four IGBTs 161 and the anode terminals of the diodes 162 are connected to the module AC terminal 150.

On the lower arm side, the four IGBTs 163 and the four diodes 164 are connected in parallel. The source terminals of the four IGBTs 163 and the cathode terminals of the diodes 164 are connected to the module AC terminal 150. In addition, the emitter terminals of the four IGBTs 163 and the anode terminals of the diodes 164 are connected to the module negative pole terminal 121.

The gate terminals 166 of the IGBTs 162 and 163 are connected to the gate wires provided in a control signal substrate 400. The emitter terminals 167 of the IGBTs 162 and 163 are connected to the emitter wires provided in the control signal substrate 400.

In each of the gate wires of the two control signal substrate 400, four gate resistors 430 are inserted to suppress resonance between the gates of the IGBTs 162 and 163 connected in parallel.

The gate signals input from the control terminals 171 and 172 are input to a gate terminal 410 and an emitter terminal 420 of the control signal substrate 400. These signals are branched into four by the wires on the control signal substrate 400 and input to the gate terminal 166 and the emitter terminal 167 of the IGBTs 162 and 163.

Figure 4:
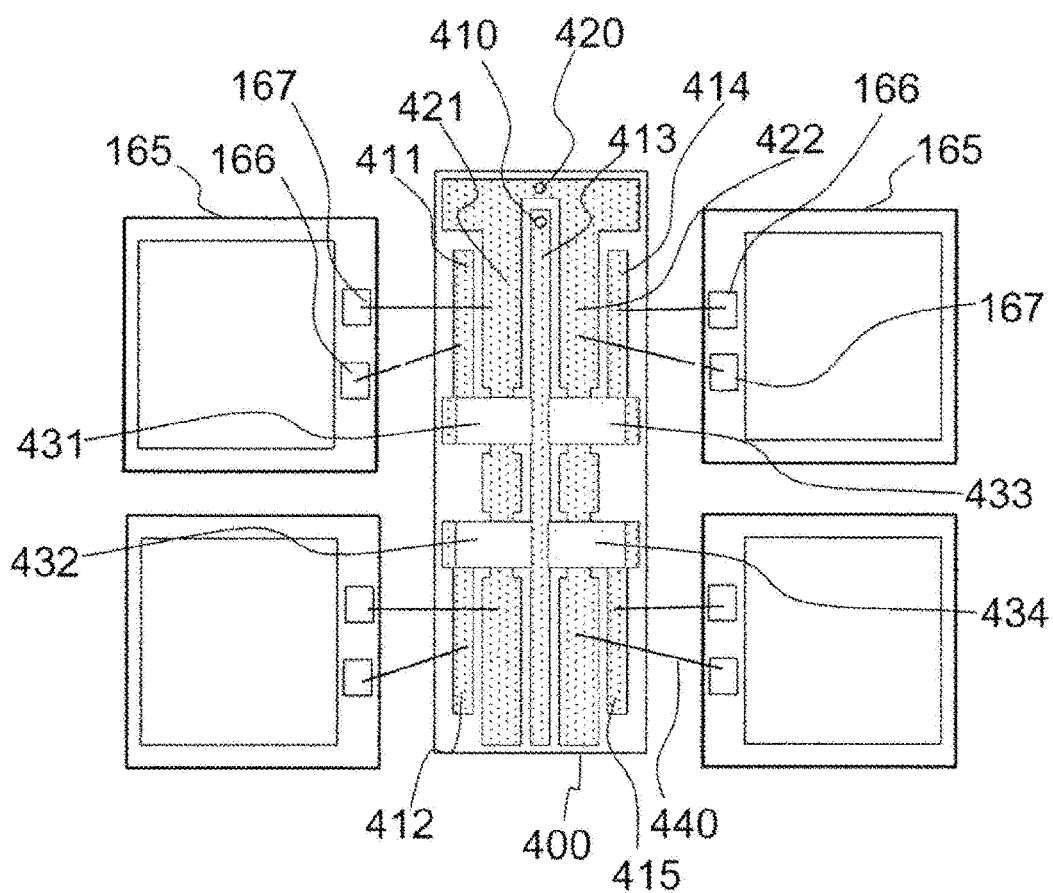
FIG. 4 is a top view of the power module when four IGBT elements 165 are connected in parallel.

FIG. 4 is a top view of the power module when the four IGBTs 165 are connected in parallel.

IGBTs 165 are disposed two by two with the control signal substrate 400 interposed between the IGBTs 165. In the control signal substrate 400, a first gate wire 411, a second gate wire 412, a third gate wire 413, a fourth gate wire 414, and a fifth gate wire 415 are disposed.

In addition, a first emitter wire 421 is disposed between the first gate wire 411 and the third gate wire 413, and between the second gate wire 412 and the third gate wire 413.

A second emitter wire 422 is disposed between the fourth gate wire 414 and the third gate wire 413, and between the fifth gate wire 415 and the third gate wire 413.

A first gate resistor 431 is connected to the first gate wire 411 and the third gate wire 413 over the first emitter wire 421.

A second gate resistor 432 is connected to the second gate wire 412 and the third gate wire 413 over the first emitter wire 421.

Similarly, a third gate resistor 433 is connected to the fourth gate wire 414 and the third gate wire 413 over the second emitter wire 422. A fourth gate resistor 434 is connected to the fifth gate wire 415 and the third gate wire 413 over the second emitter wire 422.

The gate terminal 166 of an IGBT 165 is connected to the gate wire of the control signal substrate 400 by a wire bonding 440. The emitter terminal 167 of the IGBT 165 is connected to the emitter wire of the control signal substrate 400 by the wire bonding 440.

With such a configuration, the gate signal input between the gate terminal 410 and the emitter terminal 420 of the control signal substrate 400 can be branched at equal distances by the gate wire on the control signal substrate 400 to be transferred to each IGBT.

In addition, as another effect, the magnetic flux caused by the gate signal flowing in the gate wire is canceled with the magnetic flux caused by the gate current flowing to the emitter wire between the two gate wires. Therefore, the inductance of the gate wire can be reduced. Further, since the gate resistor is provided over the emitter wire, it is possible to reduce a mounting area of a signal wire substrate.

Hereinbelow, a principle of the inductance reduction of the gate wire will be described.

Figure 5:
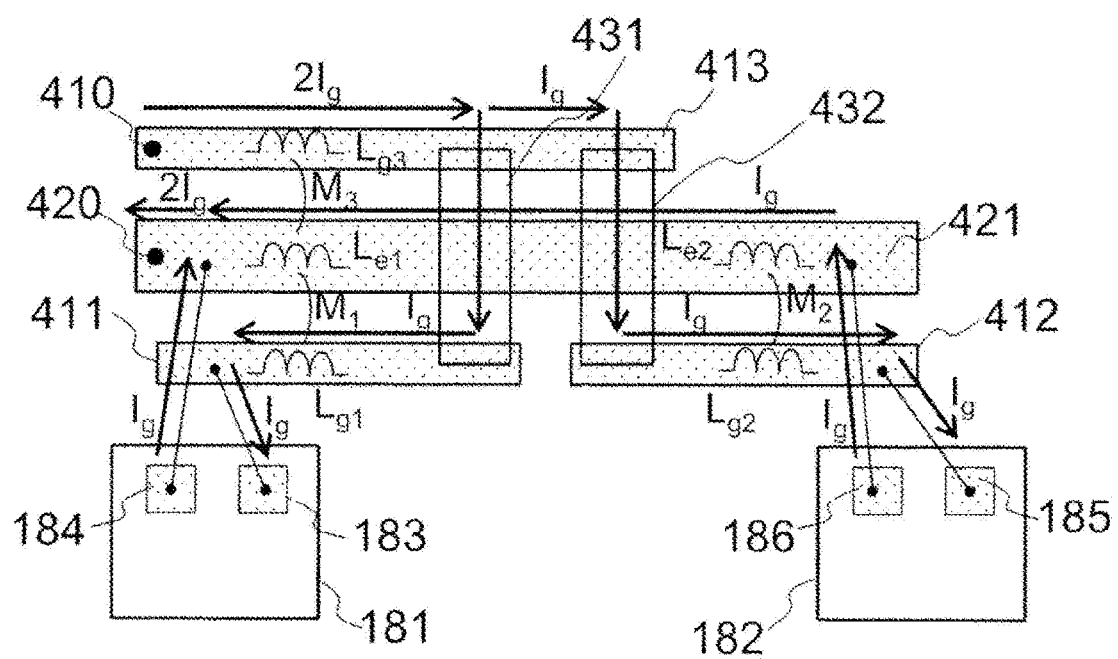
FIG. 5 is a diagram illustrating the connection among a gate wire, an emitter wire, and the IGBT of a first embodiment.

FIG. 5 illustrates a connection structure among the gate wire, the emitter wire, and the IGBT of this embodiment. Herein, for the convenience of explanation, the connection configuration of two IGBTs will be described.

A gate current 2Ig input to the gate terminal 410 of the control signal substrate 400 is branched to the first gate resistor 431 and the second gate resistor 432 through the third gate wire 413.

A gate current Ig passed through the first gate resistor 431 is applied to the first gate wire 411, and applied to a gate terminal 183 of a first IGBT 181. On the other hand, the gate current Ig flowing in the emitter wire returns to the emitter terminal 420 of the control signal substrate through the first emitter wire 421 from an emitter terminal 184 of the first IGBT 181.

Similarly, the gate current Ig is applied to a gate terminal 185 of a second IGBT 182 through the second gate resistor 432 and the second gate wire 412. In addition, the gate current Ig returns to the emitter terminal 420 of the control signal substrate through the first emitter wire 421 from an emitter terminal 186 of the second IGBT 182.

At this time, the self-inductance of the first gate wire 411 is denoted by Lg1, the self-inductance of the second gate wire 412 is denoted by Lg2, the self-inductance of the third gate wire 413 is denoted by Lg3, the self-inductance of the emitter wire 421 facing the first gate wire is denoted by Le1, and the self-inductance of the emitter wire 421 facing the second gate wire 412 is denoted by Le2.

Figure 6:
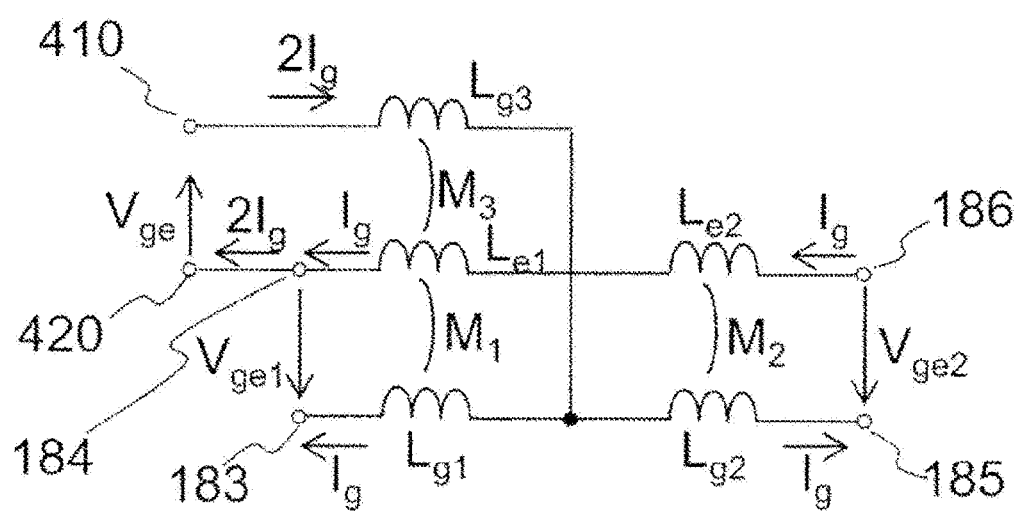
FIG. 6 is a diagram illustrating an electrical diagram of the gate wire and the emitter wire of the first embodiment.

In addition, if the mutual inductance between the first gate wire 411 and the first emitter wire 421 is denoted by M1, the mutual inductance between the second gate wire 412 and the first emitter wire 421 is denoted by M2, and the mutual inductance between the third gate wire 413 and the first emitter wire 421 is denoted by M3, an electrical diagram illustrated in FIG. 6 can be expressed.

Herein, the resistance of each wire is ignored in order to focus on an influence of inductances each gate wire and emitter wire. In addition, the mutual inductance between the first gate wire 411 and the third gate wire 413 is ignored because a distance therebetween is separated away. A voltage Vge1 between the gate terminal 183 and the emitter terminal 184 of the first IGBT 181 is defined as the following equation in which the voltage between the gate terminal 410 and the emitter terminal 420 of the control signal substrate 400 is Vge, and the flowing current is represented by Ig.

[Math. 1]

$$V_{ge1} = V_{ge} - (L_{g2} \cdot 2I_g - M_3 \cdot I_g) - (L_{g1} \cdot I_g + M_1 \cdot I_g) = V_{ge} - (2L_{g3} + L_{g1} + M_1 - M_3)I_g \quad \text{(Math. 1)}$$

Herein, it is assumed that the current Ig equally flows in the first gate wire 411 and the second gate wire 412. On the other hand, a voltage Vge2 between the gate terminal 185 and the emitter terminal 186 of the second IGBT 182 is defined as the following equation.

[Math. 2]

$$V_{ge2} = V_{ge} - (L_{g3} \cdot 2I_g - M_3 \cdot I_g) - (L_{g2} \cdot I_g - M_2 \cdot I_g) - (L_{g1} \cdot I_g + M_1 \cdot I_g - M_3 \cdot 2I_g) - (L_{g2} \cdot I_g - M_2 \cdot I_g) = V_{ge} - (2L_{g3} + L_{g2} + L_{g1} + L_{g2} - 2M_2 - 2M_3)I_g \quad \text{(Math. 2)}$$

A difference of the gate voltages applied to the first IGBT and the second IGBT is defined as the following Math. 3 from Maths. 1 and 2.

[Math. 3]

$$\begin{aligned} V_{ge1} - V_{ge2} &= (2L_{g3} + L_{g2} + L_{e1} + L_{e2} - 2M_2 - 2M_3)I_g - \\ &\quad (2L_{g3} + L_{g1} + M_1 - M_3)I_g \\ &= (-L_{g1} + L_{g2} + L_{e1} + L_{e2} - M_1 - 2M_2 - M_3)I_g \end{aligned} \quad \text{(Math. 3)}$$

In other words, a voltage difference is expressed by a product of the inductance and the gate current Ig. Herein, if it is assumed that the wires are symmetric for the sake of simplicity, and Lg=Lg1=Lg2, Le=Le1=Le2, M=M1=M2=M3 are assumed, the difference of the gate voltages applied to the first IGBT 181 and the second IGBT 182 (that is, the gate wire inductance difference ΔL) is defined as Math. 4.

[Math. 4]

$$\Delta L = 2(L_e - 2M) \quad \text{(Math. 4)}$$

Next, a normal control signal substrate will be considered in which the emitter wire is not passed over by the gate resistor. Herein, the control signal substrate illustrated in FIG. 7 will be considered. The gate current applied to the gate terminal of the control signal substrate is branched by four gate resistors 431 to 434 after passing through the third gate wire, and reaches four IGBTs 165.

Figure 8:
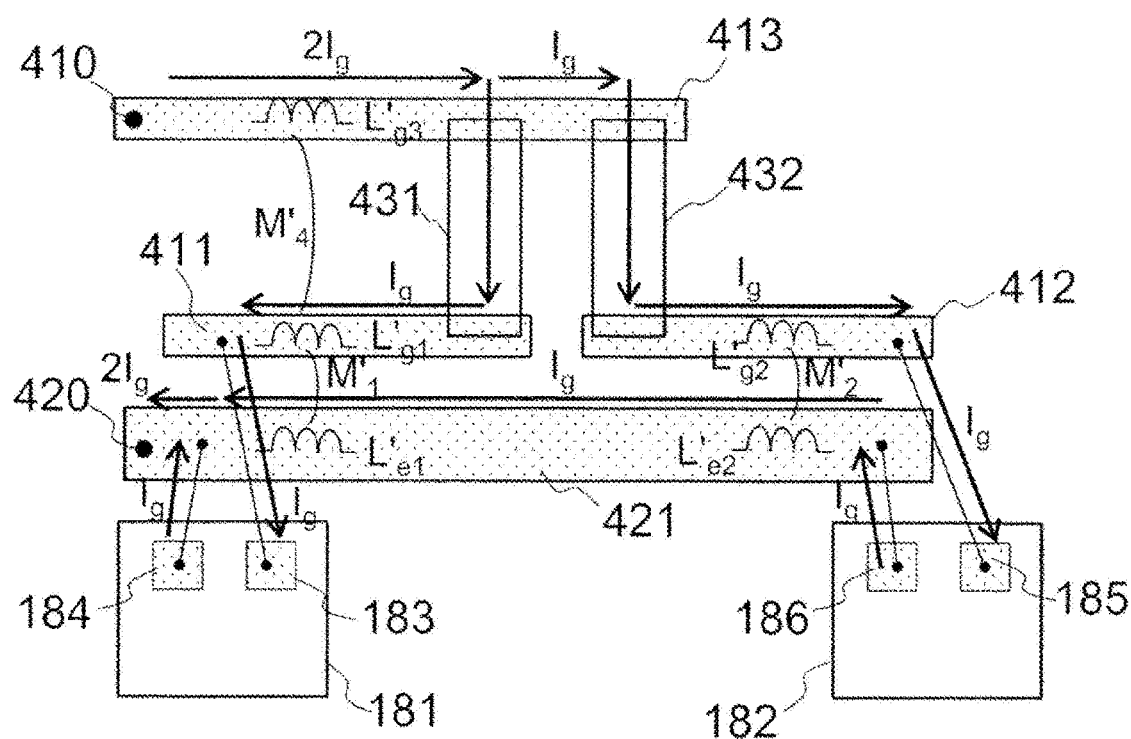
FIG. 8 is a diagram illustrating the connection among the gate wire, the emitter wire, and the IGBT in the configuration of FIG. 7.

Herein, for the convenience of explanation, the connection configuration of two IGBTs will be described as illustrated in FIG. 8. The gate current 2Ig input to the gate terminal 410 of the control signal substrate is branched to the first gate resistor 431 and the second gate resistor 432 through the third gate wire 413.

A gate current Ig passed through the first gate resistor 431 is applied to the first gate wire 411, and applied to a gate terminal 183 of a first IGBT 181. On the other hand, the gate current Ig flowing in the emitter wire returns to the emitter terminal 420 of the control signal substrate through the first emitter wire 421 from an emitter terminal 184 of the first IGBT 181.

Figure 9:
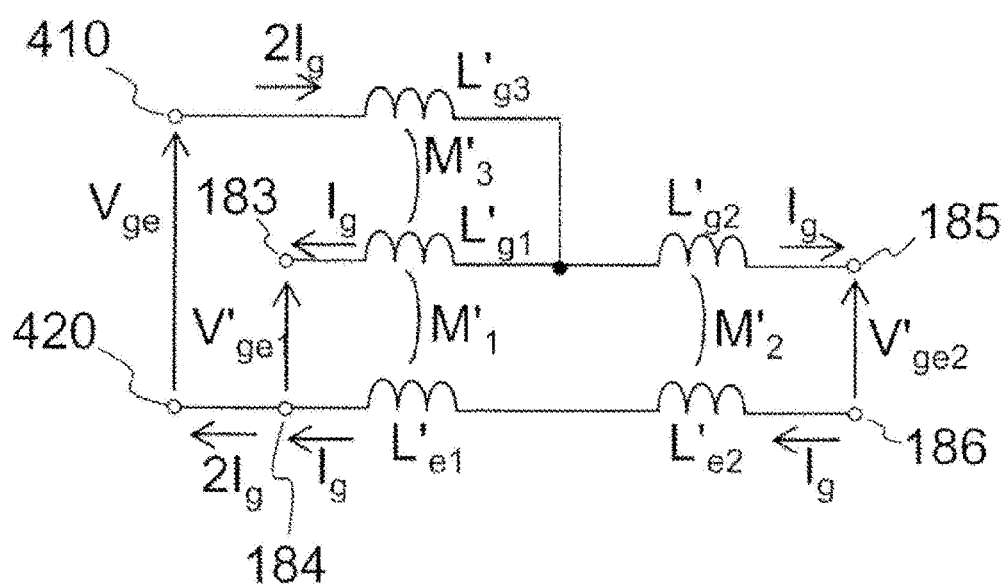
FIG. 9 is an electrical diagram of the gate wire and the emitter wire in the configuration of FIG. 7.

Similarly, the gate current Ig applied to the gate terminal 185 of the second IGBT 182 passes through the second gate resistor 432 and the second gate wire 412. In addition, the gate current Ig returns to the emitter terminal 420 of the control signal substrate through the first emitter wire 421 from an emitter terminal 186 of the second IGBT 182. At this time, the self-inductance of the first gate wire 411 is denoted by L'g1, the self-inductance of the second gate wire 412 is denoted by L'g2, the self-inductance of the third gate wire 413 is denoted by L'g3, the self-inductance of the emitter wire 421 facing the first gate wire is denoted by L'e1, and the self-inductance of the emitter wire 421 facing the second gate wire 412 is denoted by L'e2. In addition, if the mutual inductance between the first gate wire 411 and the first emitter wire 421 is denoted by M'1, the mutual inductance between the second gate wire 412 and the first emitter wire 421 is denoted by M'2, and the mutual inductance between the first gate wire 411 and the third gate wire 413 is denoted by M'4, an equivalent electrical diagram illustrated in FIG. 9 can be expressed. Herein, the resistance of each wire is ignored in order to focus on an influence of inductances each gate wire and emitter wire. In addition, the mutual inductance between the third gate wire 413 and the first emitter wire 421 is ignored because a distance therebetween is separated away. A voltage V'ge1 between the gate terminal 183 and the emitter terminal 184 of the first IGBT 181 is defined as the following equation in which the voltage between the gate terminal 410 and the emitter terminal 420 of the control signal substrate 400 is represented by Vge, and the flowing current is represented by Ig.

[Math. 5]

$$V'_{ge1} = V_{ge} - (L'_{g3} \cdot 2I_g - M'_4 \cdot I_g) - (L'_{g1} \cdot I_g + M'_1 \cdot I_g) = V_{ge} - (2L'_{g3} + L'_{g1} + M'_1 - M'_4)I_g \quad \text{(Math. 5)}$$

Herein, it is assumed that the current Ig equally flows in the first gate wire 411 and the second gate wire 412. On the other hand, a voltage V'ge2 between the gate terminal 185 and the emitter terminal 186 of the second IGBT 182 is defined as the following equation.

[Math. 6]

$$V'_{ge2} = V_{ge} - (L'_{g3} \cdot 2I_g - M'_4 \cdot I_g) - (L'_{g2} \cdot I_g - M'_2 \cdot I_g) - (L'_{g1} \cdot I_g + M'_2 \cdot I_g) - (L'_{g2} \cdot I_g - M'_2 \cdot I_g) = V_{ge} - (2L'_{g3} + L'_{g2} + L'_{e1} + L'_{e2} + M'_1 - 2M'_2 - M'_4)I_g \quad \text{(Math. 6)}$$

A difference of the gate voltages applied to the first IGBT and the second IGBT is defined as the following Math. 7 from Maths. 5 and 6.

[Math. 7]

$$V'_{ge1} - V'_{ge2} = (2L'_{g3} + L'_{g2} + L'_{e1} + L'_{e2} + M'_1 - 2M'_2 - M'_4)I_g - \quad \text{(Math. 7)}$$
$$(2L'_{g3} + L'_{g1} + M'_1 - M'_4)I_g$$
$$= (-L'_{g1} + L'_{g2} + L'_{e1} + L'_{e2} - 2M'_2)I_g$$

In other words, a voltage difference is expressed by a product of the inductance and the gate current Ig. Herein, if it is assumed that the wires are symmetric for the sake of simplicity, and L'g=L'g1=L'g2, L'e=L'e1=L'e2, and M'=M'1=M'2=M'4 are assumed, the difference of the gate voltages applied to the first IGBT 181 and the second IGBT 182 (that is, the gate wire inductance difference ΔL) is defined as the following Math. 8.

[Math. 8]

$$\Delta L' = 2(L'_e - M') \quad \text{(Math. 8)}$$

Figure 7:
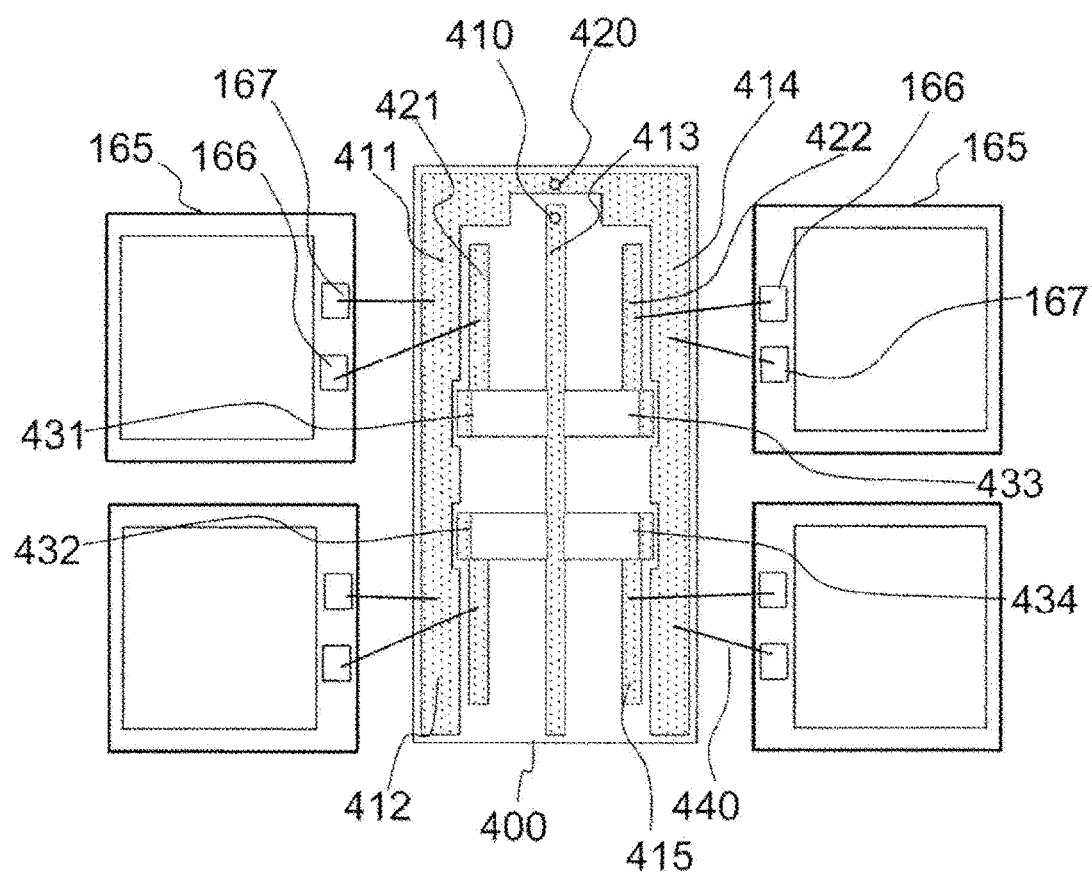
FIG. 7 is a diagram illustrating an example of a configuration where normal four IGBTs and a control signal substrate are disposed.

Next, the inductance difference (Math. 4) of the control signal in the layout of this embodiment illustrated in FIG. 4 and the inductance difference (Math. 8) in the normal layout illustrated in FIG. 7 will be compared. In a case where the wire width and the wire interval are equal in both layouts, the self-inductance of the emitter wire and the mutual inductance between wires become equal in both layouts. In other words, Le=L'e and M=M' are satisfied. At this time, it can be seen that the inductance difference of this embodiment (Math. 4) becomes small, and the current unbalancing of the control signal applied to the IGBT can be suppressed.

Figure 10:
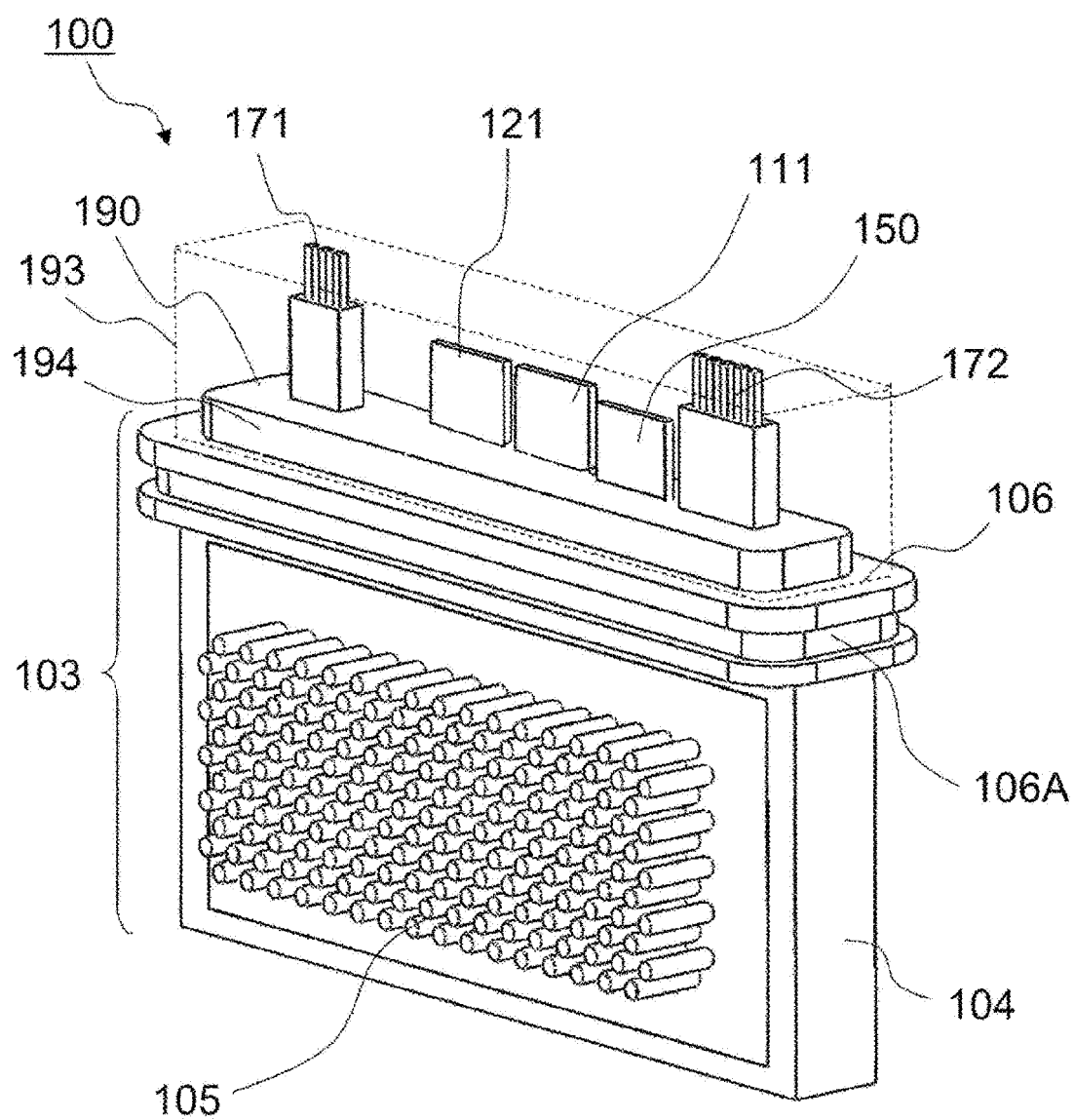
FIG. 10 is a perspective exterior view of the power semiconductor module 100.

Subsequently, an exemplary configuration of the power semiconductor module 100 used in the power conversion device of the first embodiment will be described. FIG. 10 is a diagram illustrating an example of a configuration of the power semiconductor module 100 which is used in the power conversion device of this embodiment. As illustrated in FIG. 3, the power semiconductor module 100 is configured by the IGBT 161 and the diode 162 of the upper arm, and the IGBT 163 and the diode 164 of the lower arm.

The power semiconductor module 100 of this embodiment is molded with resin in order to protect the IGBTs and the diodes therein. In the molded terminal surface 190 of the power semiconductor module 100, the module positive pole terminal 111, the module negative pole terminal 121, and the module AC terminal 150 are provided to be connect to the positive pole terminal 311 or the negative pole terminal 321. In addition, these terminals (the positive pole terminal 111, the negative pole terminal 121, and the AC terminal 150) are disposed such that each of the main surfaces is overlapped on one virtual surface. Therefore, in a procedure of molding the power semiconductor module 100, a molding procedure can be made easy since the shape of a molding tool of the terminal portion can be made simple.

The description will be given about an example of a detailed embodiment of the power semiconductor module using FIGS. 10 to 12. FIG. 10 is a perspective exterior view of the power semiconductor module 100. The power semiconductor module 100 includes the case 103 in which all the portion is sealed except the opening where the terminal is output. The case 103 is configured by a frame 104 which forms side walls and a bottom surface, a heat dissipation fin 105 which cools down the power semiconductor element, and a flange portion 106.

The heat dissipation fin 105 is formed in a front surface which is widest and perpendicular to the side walls and the bottom surface of the case 103. The heat dissipation fin 105 is formed in the similar shape even in a surface opposite to the front surface.

The flange portion 106 serves as a positioning role when the power semiconductor module 100 is assembled to the power conversion device. The power semiconductor module 100 of this embodiment is assumed to be a power conversion device in which a heat dissipation portion where the heat dissipation fin 105 is formed directly abuts on a coolant. The flange portion 106 also serves as a role of securing airtightness between the terminal and the heat dissipation portion where the coolant abuts. In a groove 106A provided in the flange portion 106, there is provided a member to secure airtightness such as an O ring. Further, herein, the description has been given about a direct cooling type of the power conversion device as described above. However, the power semiconductor module of this embodiment is not particularly limited to these usages, and may be used in other types of the power conversion device.

An insulating mold terminal 193 is configured by the module positive pole terminal 111, the module negative pole terminal 121, the module AC terminal 150, the module control terminals 171 and 172, and a mold member 194.

In the mold member 194, a plurality of through holes are formed to make these terminals (the module positive pole terminal 111, the module negative pole terminal 121, the module AC terminal 150, and the module control terminals 171 and 172) pass through. With the mold member 194, these terminals are electrically insulated from each other.

In addition, there may be configured a separated insulating plate assembled between the terminals to secure insulation.

Figure 11:
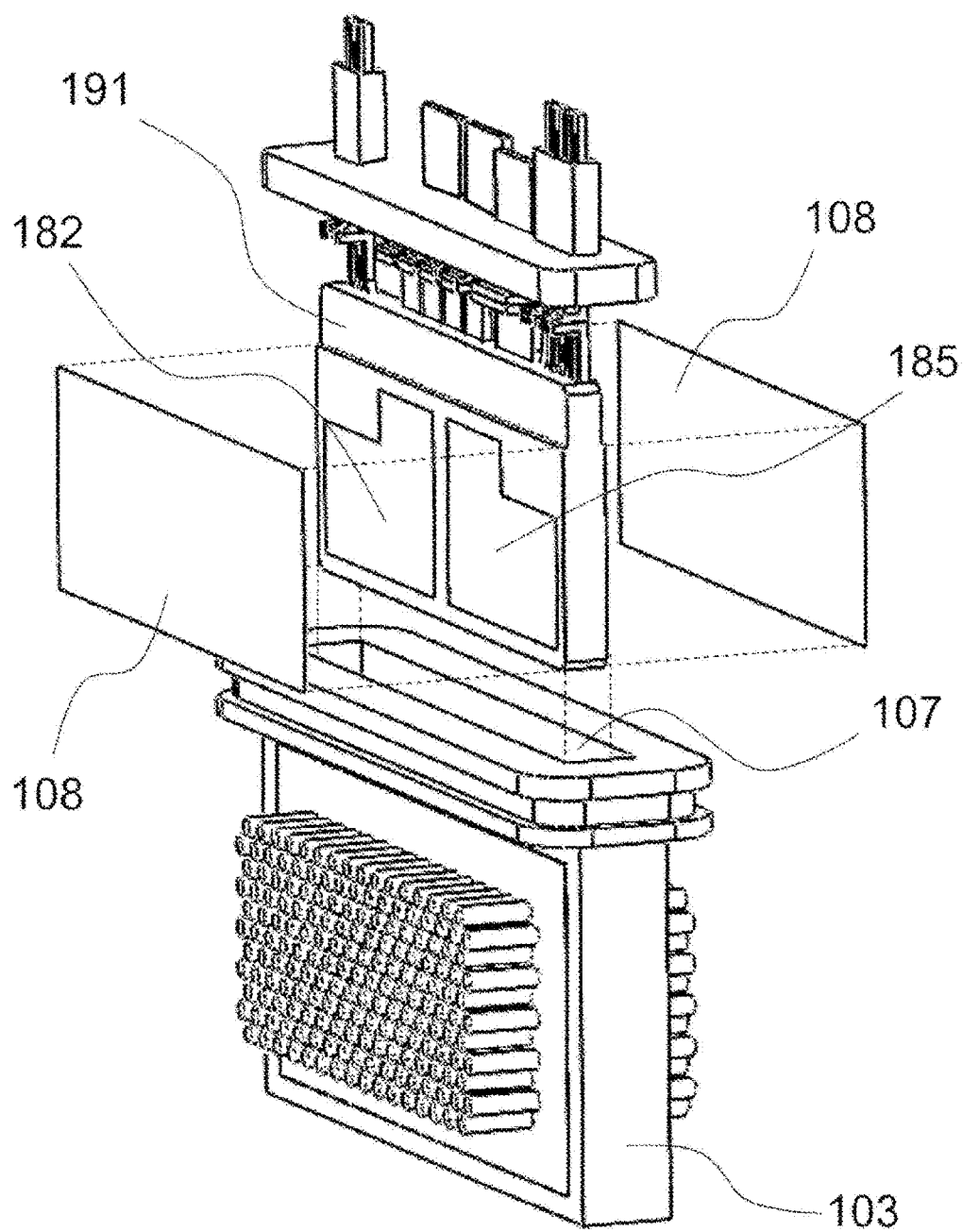
FIG. 11 is an exploded perspective view illustrating a procedure of assembling a module sealing body 191 to a case 103 of the power semiconductor module 100.

FIG. 11 is an exploded perspective view illustrating a procedure of assembling a module sealing body 191 to the case 103 of the power semiconductor module 100. The module sealing body 191 in which the power semiconductor elements (the IGBT 161 and the diode 162 of the upper arm, and the IGBT 163 and the diode 164 of the lower arm) are sealed and built is inserted to an insertion hole 107 of the case 103. At this time, an insulating member 108 is disposed to face each surface of the module sealing body 191.

Figure 12:
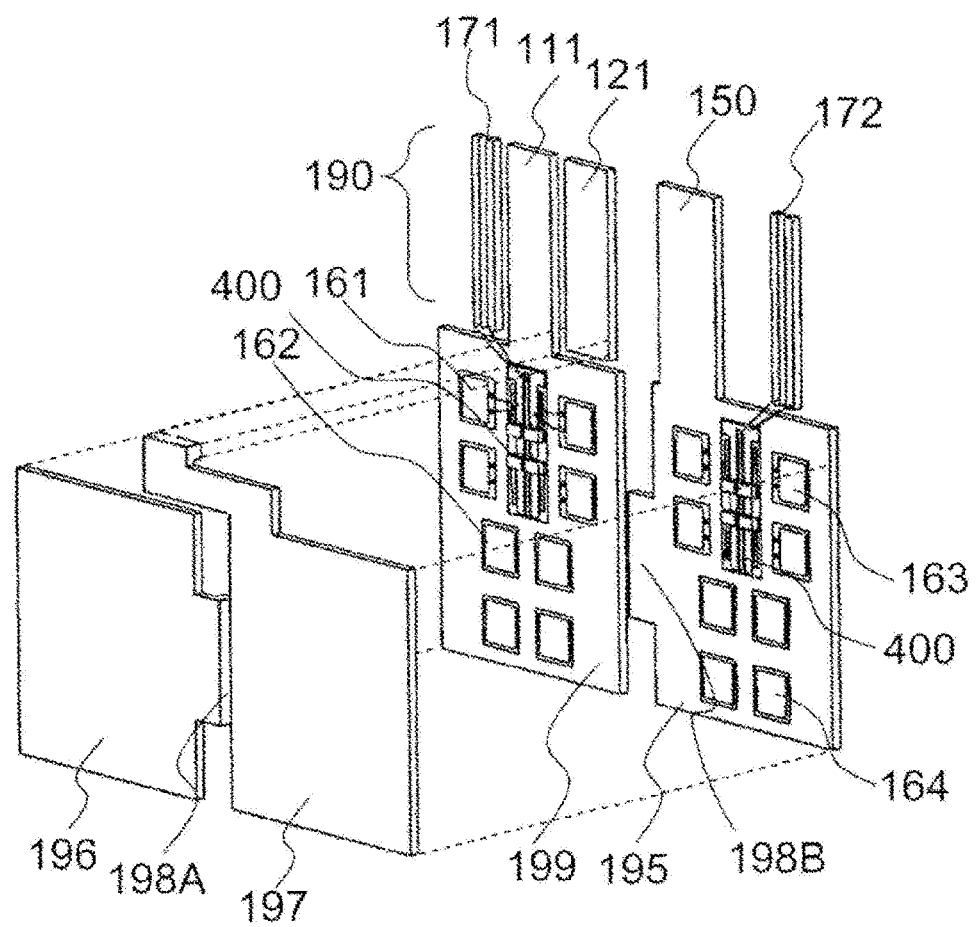
FIG. 12 is an exploded perspective view of a circuit component of a series circuit of upper/lower arms of the power semiconductor module 100.

FIG. 12 is an exploded perspective view of a circuit component of a series circuit of upper/lower arms of the power semiconductor module 100. In FIG. 12, a sealing material of the module sealing body 191 is not illustrated.

Four IGBTs 161 connected in parallel of the upper arm circuit are disposed such that the collector electrode of the IGBT 161 is bonded to a conductor plate 199. The four diodes 162 connected in parallel of the upper arm circuit are disposed such that the cathode electrode of the diode 162 is bonded to the conductor plate 199. An electrode plate 196 is disposed to face the electrode plate 199 with the IGBT 161 and the diode 162 interposed between the electrode plate 196 and the electrode plate 199. The electrode plate 196 is bonded to the emitter electrode of the IGBT 161 and the anode electrode of the diode 162. The power semiconductor elements (the IGBT 161, the diode 162) of the upper arm circuit are connected in parallel such that the power semiconductor elements are interposed between the electrode plate 199 and the electrode plate 196 in parallel. In addition, the control signal substrate 400 is disposed on the conductor plate 199 to branch and transfer the control signal to the IGBT 161 connected in parallel.

Four IGBTs 163 connected in parallel of the lower arm circuit are disposed such that the collector electrode of the IGBT 163 is bonded to a conductor plate 195. The four diodes 164 connected in parallel of the lower arm circuit are disposed such that the cathode electrode of the diode 164 is bonded to the conductor plate 195. An electrode plate 197 is disposed to face the electrode plate 195 with the IGBT 163 and the diode 164 interposed between the electrode plate 197 and the electrode plate 195. The electrode plate 197 is bonded to the emitter electrode of the IGBT 163 and the anode electrode of the diode 164. The power semiconductor elements (the IGBT 163, the diode 164) of the lower arm circuit are connected in parallel such that the power semiconductor elements are interposed between the electrode plate 195 and the electrode plate 197 in parallel. In addition, the control signal substrate 400 is disposed on the conductor plate 195 to branch and transfer the control signal to the IGBT 161 connected in parallel.

The conductor plate 196 and the conductor plate 195 are connected by metal-bonding an intermediate electrode 198A formed in the conductor plate 196 and an intermediate electrode 198B formed in the conductor plate 195. In other words, the power semiconductor elements (the IGBT 161, the diode 162) of the upper arm circuit and the power semiconductor elements (the IGBT 163, the diode 164) of the lower arm circuit form a circuit connected in series.

In addition, the signal terminals 171 and 172 are connected to the gate terminal 410 or the emitter terminal 420 of the control signal substrate by bonding-wire.

The conductor plate 196 and the conductor plate 197 are disposed on the same plane. In addition, as illustrated in FIG. 11, these conductor plates 196 and 197 are disposed such that the surfaces opposite to the surface where the IGBT and the diode are bonded are exposed from the sealing material of the module sealing body 191.

The conductor plate 195 and the conductor plate 199 are disposed on the same plane. In addition, while not illustrated in FIG. 11, these conductor plates 195 and 199 are disposed such that the surfaces opposite to the surface where the IGBT and the diode are bonded are exposed from the sealing material of the module sealing body 191.

The exposed surfaces of the conductor plates 195, 196, 197, and 199 are disposed to face the heat dissipation fin 105 of the case 103.

In addition, the module positive pole terminal 111, the module negative pole terminal 121, and the module AC terminal 150 protrude from the module terminal surface 190 of the module sealing body 191. As described above, these terminals are disposed such that the main surfaces are overlapped with one virtual plane.

In the power semiconductor module 100 of this embodiment, the case 103 is formed of a conductive member, for example, a composite such as Cu, Cu alloy, Cu—C, and Cu—CuO, or a composite such as Al, Al alloy, AlSiC, and Al—C. In addition, the case 103 is formed by a bonding method having a high waterproof property such as welding, or forging, or casting.

As a sealing material of the module sealing body 191, a resin based on novolak-based, polyfunctional and biphenyl-based epoxy resin can be used. Ceramics such as SiO2, Al2O3, AlN, and BN, gel, or rubber are incorporated to bring the coefficient of thermal expansion close to the conductor plates 195, 196, 197, and 199. With this configuration, a difference in the coefficient of thermal expansion between the members can be lowered. A thermal stress generated when the temperature depending on use environments is increased is significantly lowered. Therefore, it is possible to increase the span of life of the power semiconductor module.

As a metal-bonding adhesive used in bonding the conductor plate and the power semiconductor element, for example, a soft brazing material (solder) based on Sn-alloy, a hard brazing material such as Al alloy and Cu alloy, or a sintered metal material using nano-metal particles/micro-metal particles can be used.

Second Embodiment

In this embodiment, the description will be given about an example of a configuration when eight IGBTs are connected in parallel.

The configuration of the power conversion device of this embodiment will be described using FIG. 13. However, the description of portions having the same function as that of the configurations to which the same symbol already described in the first embodiment is attached will be omitted.

Figure 13:
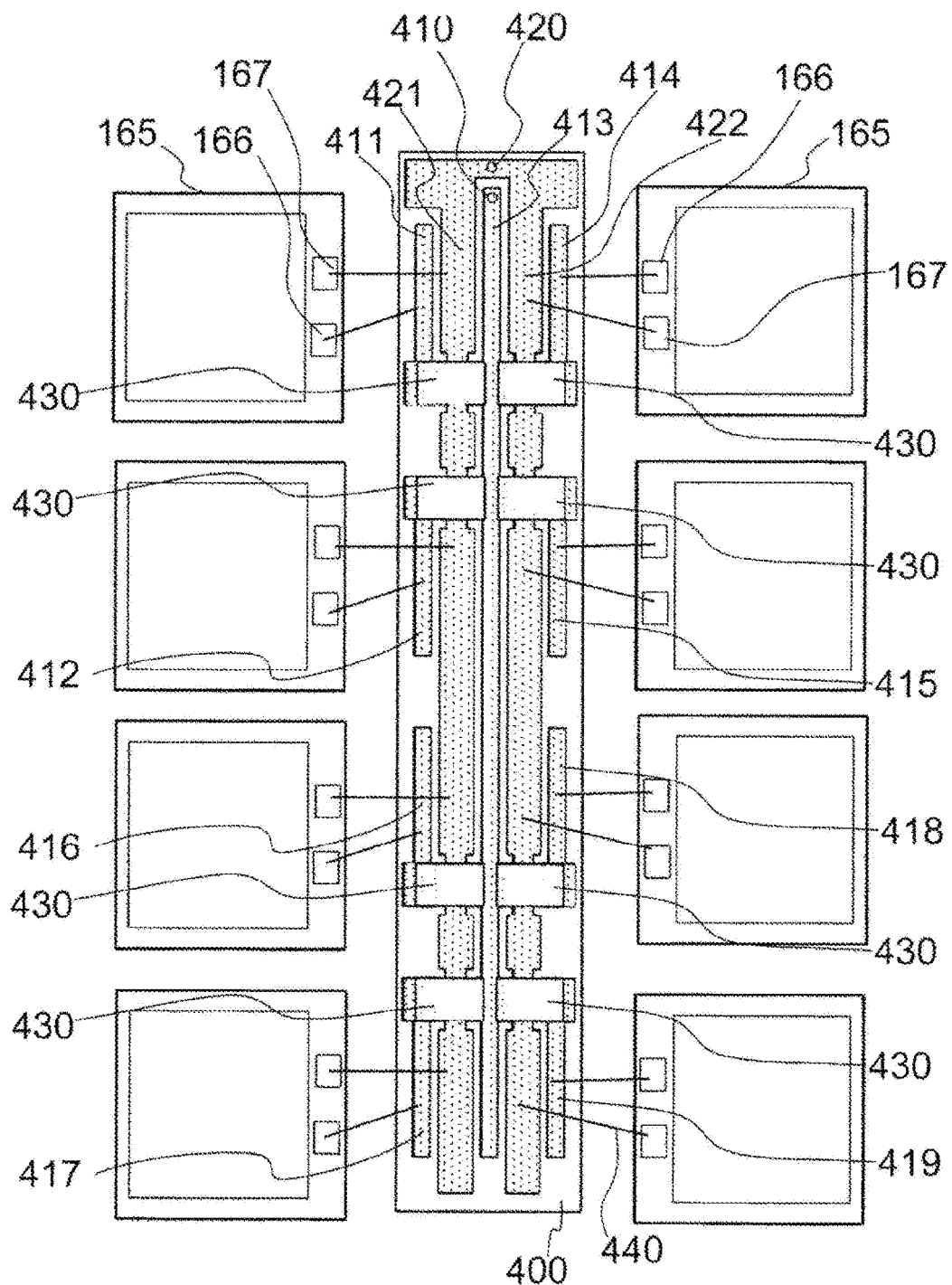
FIG. 13 is a diagram illustrating an example of a configuration where eight IGBTs and the control signal substrate of the first embodiment are disposed.

FIG. 13 is a diagram illustrating an example of a configuration of the power conversion device of this embodiment. In this embodiment, the description will be given about a structure which can reduce the current unbalancing between the IGBTs when the eight IGBTs 165 are connected in parallel. The control signal substrate 400 includes the gate wires 411 to 419 which branch the gate signal applied to the gate terminal 410 of the control signal substrate to the eight IGBTs 165. The third gate wire 413, the first gate wire 411, the second gate wire 412, a sixth gate wire 416, a seventh gate wire 417 are connected by the gate resistor 430 over the first emitter wire 421. These gate wires are disposed to be adjacent to the first emitter wire 421. Therefore, the inductance difference can be reduced according to the principle described in the first embodiment by canceling the inductance caused by the current flowing in the gate wire and the current flowing in the emitter wire. Similarly, the third gate wire 413, the fourth gate wire 414, the fifth gate wire 415, an eighth gate wire 418, a ninth gate wire 419 are connected by the gate resistor 430 over the second emitter wire 422. These gate wires are disposed to be adjacent to the second emitter wire 422. Therefore, the inductance difference can be reduced by canceling the inductance caused by the current flowing in the gate wire and the current flowing in the emitter wire.

Further, the invention is not limited to the above embodiments, but various modifications may be contained. For example, the above-described embodiments of the invention have been described in detail in a clearly understandable way, and are not necessarily limited to those having all the described configurations. In addition, the Si-IGBT has been described as the power semiconductor in the above embodiment. However, even in a case where a power semiconductor made of SiC or GaN is used, the similar effects are obtained. Further, some of the configurations of a certain embodiment may be replaced with the configurations of the other embodiments, and the configurations of the other embodiments may be added to the configurations of the subject embodiment. In addition, some of the configurations of each embodiment may be omitted, replaced with other configurations, and added to other configurations.

REFERENCE SIGNS LIST

100 power semiconductor module
103 case
104 frame
105 heat dissipation fin
106 flange
106A groove
107 insertion hole
108 insulating member
111 module positive pole terminal
121 module negative pole terminal
150 module AC terminal
161 IGBT of upper arm
162 diode of upper arm
163 IGBT of lower arm
164 diode of lower arm
165 IGBT
166 gate terminal of IGBT
167 emitter terminal of IGBT
171 control terminal of upper arm
172 control terminal of lower arm
190 molded terminal surface
191 module sealing body
193 insulating mold terminal
194 mold member
195 conductor plate
196 conductor plate
197 conductor plate
198 intermediate electrode
199 conductor plate
200 capacitor module
310 positive pole conductor
311 positive pole terminal
319 DC input/output positive pole terminal
320 negative pole conductor
321 negative pole terminal
329 DC input/output negative pole terminal
400 control signal substrate
410 gate terminal
411 first gate wire
412 second gate wire
413 third gate wire
414 fourth gate wire
415 fifth gate wire
416 sixth gate wire
417 seventh gate wire
418 eighth gate wire
419 ninth gate wire
420 emitter terminal
421 first emitter wire
422 second emitter wire
430 gate resistor of control signal substrate
431 first gate resistor
432 second gate resistor
433 third gate resistor
434 fourth gate resistor
440 wire bonding
500 power conversion device

The invention claimed is:

1. A power conversion device, comprising:
    a first power semiconductor element;
    a second power semiconductor element; and
    a circuit board which includes a circuit to transfer a drive signal of the first power semiconductor element and the second power semiconductor element,
    wherein the circuit board includes
    a first emitter wire which is formed along an arranging direction of the first power semiconductor element and the second power semiconductor element,
    a first gate wire which is disposed between the first power semiconductor element and the first emitter wire,
    a second gate wire which is disposed between the second power semiconductor element and the first emitter wire,
    a third gate wire which is disposed to face the first gate wire and the second gate wire with the first emitter wire interposed between the third gate wire and the first gate wire and the second gate wire, and
    a first gate resistor which connects the first gate wire and the third gate wire over the first emitter wire.

2. The power conversion device according to claim 1, wherein the circuit board includes a second gate resistor which connects the second gate wire and the third gate wire over the first emitter wire.

3. A power conversion device, comprising:
    a first power semiconductor element;
    a second power semiconductor element; and
    a circuit board which includes a circuit to transfer a drive signal of the first power semiconductor element and the second power semiconductor element,
    wherein the circuit board includes
    a first emitter wire and a second emitter wire which are formed in a traversing direction with respect to an arranging direction of the first power semiconductor element and the second power semiconductor element,
    a first gate wire which is disposed between the first power semiconductor element and the first emitter wire,
    a fourth gate wire which is disposed between the second power semiconductor element and the second emitter wire,
    a third gate wire which is disposed between the first emitter wire and the second emitter wire, and a first gate resistor which connects the first gate wire and the third gate wire over the first emitter wire.

4. The power conversion device according to claim 3, wherein the circuit board includes a second gate resistor which connects the fourth gate wire and the third gate wire over the second emitter wire.

\* \* \* \* \*